(12) United States Patent
Shrivastava et al.

(10) Patent No.: US 8,612,199 B2
(45) Date of Patent: Dec. 17, 2013

(54) NETLIST PARTITIONING FOR CHARACTERIZING EFFECT OF WITHIN-DIE VARIATIONS

(75) Inventors: Sachin Shrivastava, Noida (IN); Harindranath Parameswaran, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 362 days.

(21) Appl. No.: 11/961,787

(22) Filed: Dec. 20, 2007

(65) Prior Publication Data

US 2009/0164194 A1 Jun. 25, 2009

(51) Int. Cl.
*G06F 17/50* (2006.01)

(52) U.S. Cl.
USPC .......................................................... 703/14

(58) Field of Classification Search
USPC ........................................ 703/14; 716/4, 104
See application file for complete search history.

(56) References Cited

U.S. PATENT DOCUMENTS

| | | | | |
|---|---|---|---|---|
| 5,446,676 A * | 8/1995 | Huang et al. | | 703/19 |
| 5,802,349 A * | 9/1998 | Rigg et al. | | 716/103 |
| 6,718,524 B1 * | 4/2004 | Mbouombouo | | 716/4 |
| 6,844,750 B2 * | 1/2005 | Hsu et al. | | 324/763 |
| 7,149,674 B1 * | 12/2006 | Sirichotiyakul et al. | | 703/15 |
| 2003/0229412 A1 * | 12/2003 | White et al. | | 700/121 |
| 2008/0140363 A1 * | 6/2008 | Lin et al. | | 703/2 |

OTHER PUBLICATIONS

Okada et al., "A Statistical Gate Delay Model Considering Intra-Gate Variability," ICCAD-03, pp. 908-913.
Hubner et al., "Efficient Partitioning and Analysis of Digital CMOS-Circuits,", 1992, IEEE/ACM International Conference Proceedings on Computer-Aided Design, pp. 280-283.

* cited by examiner

*Primary Examiner* — Dwin M Craig
*Assistant Examiner* — Bernard E Cothran
(74) *Attorney, Agent, or Firm* — Kenyon & Kenyon LLP

(57) ABSTRACT

Techniques are presented for determining effects of process variations on the leakage of an integrated circuit having multiple devices. The operation of the circuit is simulated using a first set of values for the process parameters for the devices and is also simulated with some of the process parameter values varied. For the simulation with the varied values, the circuit is split up into distinct components (such as channeled coupled components, CCCs), where each component has one or more devices, and a process parameters value in a device in each of two or more of these components is varied.

30 Claims, 5 Drawing Sheets

Nominal Leakage Current $I(0)$ = 1.38336

| Transistor Varied | Leakage Current $I$ | Sensitivity $[I-I(0)]$ |
|---|---|---|
| MM1 | 1.44836 | 0.06500 |
| MM2 | 1.44753 | 0.06417 |
| MM3 | 1.44476 | 0.06140 |
| MM4 | 1.38336 | 0.00000 |
| MM5 | 1.38453 | 0.00117 |
| MM6 | 1.38456 | 0.00120 |
| MM7 | 1.38456 | 0.00120 |
| MM8 | 1.38456 | 0.00120 |
| MM9 | 1.38454 | 0.00118 |
| MM10 | 1.38454 | 0.00118 |
| MM11 | 1.38452 | 0.00116 |
| MM12 | 1.43984 | 0.05648 |
| MM13 | 1.4403 | 0.05694 |
| MM14 | 1.44627 | 0.06291 |
| MM15 | 1.44643 | 0.06307 |
| MM16 | 1.44313 | 0.05977 |
| MM17 | 1.38336 | 0.00000 |
| MM18 | 1.43657 | 0.05321 |
| MM19 | 1.42906 | 0.04570 |
| MM20 | 1.38416 | 0.00080 |
| MM21 | 1.38377 | 0.00041 |
| MM22 | 1.43935 | 0.05599 |
| MM23 | 1.43003 | 0.04667 |
| MM24 | 1.42971 | 0.04635 |
| MM25 | 1.43996 | 0.05660 |
| MM26 | 1.4313 | 0.04794 |
| MM27 | 1.38369 | 0.00033 |
| MM28 | 1.47899 | 0.09563 |
| MM29 | 1.4706 | 0.08724 |
| MM30 | 1.38387 | 0.00051 |
| MM31 | 1.38387 | 0.00051 |
| MM32 | 1.38387 | 0.00051 |
| MM33 | 1.38389 | 0.00053 |
| MM34 | 1.38389 | 0.00053 |
| MM35 | 1.38389 | 0.00053 |
| MM36 | 1.38366 | 0.00030 |
| MM37 | 1.47403 | 0.09067 |
| MM38 | 1.46851 | 0.08515 |
| MM39 | 1.46743 | 0.08407 |
| MM40 | 1.46707 | 0.08371 |

*FIG. 4*

| | Transistor Varied | | | | | Currents Measured | | | | | Sensitivities | | | | |
|---|---|---|---|---|---|---|---|---|---|---|---|---|---|---|---|
| Run | CCC1 | CCC2 | CCC3 | CCC4 | CCC5 | $I_1$ (CCC1) | $I_2$ (CCC2) | $I_3$ (CCC3) | $I_4$ (CCC4) | $I_5$ (CCC5) | $I_2-I_2(0)$ (CCC1) | $I_2-I_2(0)$ (CCC2) | $I_3-I_3(0)$ (CCC3) | $I_4-I_4(0)$ (CCC4) | $I_5-I_5(0)$ (CCC5) |
| 1 | M19 | M35 | M11 | M22 | M39 | 0.07457 | 0.31718 | 0.11222 | 0.57226 | 0.49454 | 0.04556 | 0.00181 | 0.00001 | 0.05615 | 0.08391 |
| 2 | M27 | M26 | M28 | M29 | M40 | 0.02934 | 0.36346 | 0.20758 | 0.60360 | 0.49418 | 0.00033 | 0.04809 | 0.09537 | 0.08750 | 0.08355 |
| 3 | - | M18 | - | M9 | M6 | 0.02901 | 0.36781 | 0.11266 | 0.51875 | 0.41067 | - | 0.05245 | - | 0.00264 | 0.00004 |
| 4 | - | M20 | - | M30 | M8 | 0.02902 | 0.31616 | 0.11222 | 0.51780 | 0.41063 | - | 0.00079 | - | 0.00170 | 0.00001 |
| 5 | - | M25 | - | M10 | M7 | 0.02911 | 0.37106 | 0.11269 | 0.51877 | 0.41067 | - | 0.05570 | - | 0.00267 | 0.00004 |
| 6 | - | M33 | - | M31 | M37 | 0.02902 | 0.31589 | 0.11221 | 0.51678 | 0.50112 | - | 0.00053 | - | 0.00068 | 0.09049 |
| 7 | - | M34 | - | M32 | M38 | 0.02902 | 0.31589 | 0.11221 | 0.51679 | 0.49559 | - | 0.00053 | - | 0.00068 | 0.08496 |
| 8 | - | M36 | - | M24 | M5 | 0.02902 | 0.31579 | 0.11219 | 0.56251 | 0.41162 | - | 0.00042 | - | 0.04641 | 0.00100 |
| 9 | - | M14 | - | M21 | - | 0.02902 | 0.37813 | 0.11230 | 0.51666 | 0.41054 | - | 0.06277 | - | 0.00055 | - |
| 10 | - | M15 | - | M12 | - | 0.02902 | 0.37828 | 0.11230 | 0.57146 | 0.41181 | - | 0.06292 | - | 0.05535 | - |
| 11 | - | M16 | - | M13 | - | 0.02902 | 0.37499 | 0.11229 | 0.57191 | 0.41182 | - | 0.05962 | - | 0.05580 | - |
| 12 | - | M17 | - | M23 | - | 0.02902 | 0.31545 | 0.11221 | 0.56172 | 0.41161 | - | 0.00008 | - | 0.04561 | - |
| 13 | - | - | - | M1 | - | 0.02902 | 0.31536 | 0.11221 | 0.58078 | 0.41095 | - | - | - | 0.06468 | - |
| 14 | - | - | - | M2 | - | 0.02902 | 0.31536 | 0.11221 | 0.57996 | 0.41095 | - | - | - | 0.06386 | - |
| 15 | - | - | - | M3 | - | 0.02902 | 0.31536 | 0.11221 | 0.57720 | 0.41093 | - | - | - | 0.06109 | - |
| 16 | - | - | - | M4 | - | 0.02902 | 0.31536 | 0.11221 | 0.51611 | 0.41063 | - | - | - | 0.00000 | - |

*FIG. 6*

| Cell | Input Pins I | States $S=2^I$ | Number of Transistors | | Number of Spice Runs | | |
|---|---|---|---|---|---|---|---|
| | | | In Cell n | In Largest CCC m | Conventional Approach $S*(n+1)$ | Our Approach $S*(m+1)$ | % Reduction |
| NR2XD4 | 2 | 4 | 24 | 24 | 100 | 100 | 0.00% |
| ND3D8 | 3 | 8 | 48 | 48 | 392 | 392 | 0.00% |
| GOR2D1 | 2 | 4 | 6 | 4 | 28 | 20 | 28.57% |
| DFKCNQD2 | 3 | 8 | 30 | 10 | 248 | 88 | 64.52% |
| FICOND1 | 3 | 8 | 34 | 14 | 280 | 120 | 57.14% |
| DCAP4 | 0 | 1 | 4 | 1 | 5 | 2 | 60.00% |
| BUFFD8 | 1 | 2 | 22 | 16 | 46 | 34 | 26.09% |
| IOA21D4 | 3 | 8 | 20 | 16 | 168 | 136 | 19.05% |
| GINVD1 | 1 | 2 | 2 | 2 | 6 | 6 | 0.00% |
| SDFNCSND4 | 6 | 64 | 58 | 16 | 3776 | 1088 | 71.19% |
| AO221D1 | 5 | 32 | 12 | 10 | 416 | 352 | 15.38% |
| OR4D1 | 4 | 16 | 10 | 8 | 176 | 144 | 18.18% |
| INVD2 | 1 | 2 | 4 | 4 | 10 | 10 | 0.00% |
| SEDFKCND4 | 6 | 64 | 64 | 14 | 4160 | 960 | 76.92% |
| LNCSNDQD2 | 4 | 16 | 25 | 11 | 416 | 192 | 53.85% |
| DFD2 | 2 | 4 | 32 | 8 | 132 | 36 | 72.73% |
| SEDFKCNQD4 | 6 | 64 | 54 | 14 | 3520 | 960 | 72.73% |
| DFQD4 | 2 | 4 | 30 | 8 | 124 | 36 | 70.97% |
| 785 Other Cells | | | | | | | |
| ... | | | | | | | |
| ... | | | | | | | |
| Total (803 Cells) | | | | | 487743 | 244457 | 49.88% |

FIG. 7

NETLIST PARTITIONING FOR CHARACTERIZING EFFECT OF WITHIN-DIE VARIATIONS

BACKGROUND

This application relates generally to integrated circuit design and simulation and, more particularly, to techniques for determining the effect of within die variations on leakage in integrated circuits.

With shrinking process node sizes, the inherent effect of process variations is playing a larger factor in defining the behavior of a circuit. Conventional Analysis techniques can no longer claim accuracy if they do not capture the effects of process variations. There are two factors that are becoming critical in this respect: Leakage is becoming dominant in overall power consumption; and leakage power has exponential dependency on critical process parameters. Leakage power can vary by an order of magnitude due to variation of process parameters; for instance, leakage power can vary by up to a factor of 12 for a 20% variation in effective length of a transistor. Although the absolute magnitude of a process variation (such an oxide thickness, gate length, gate width, doping density, etc.) may be the same, the relative magnitude increases greatly as device sizes shrink, so that a variation that is negligible at, say, a micron, becomes far more significant at half that size. Consequently, it becomes very imperative to factor in the effects of process variations, especially in the 45 nm and below process nodes.

Analysis tools working on standard cell-based designs typically work on standard cell models for leakage. These models may be capable of representing the effects of process variations on leakage power computation, including representing correlation of leakage power between various states. Typically, the models store the data of the effect of process variations on leakage in terms of sensitivities. One common method would be to calculate sensitivity of the log of leakage power to process parameters. In this technique, S Sensitivity to process parameter p will in general be defined as follows:

$$S = \frac{\log[I(p_1)] - \log[I(p_0)]}{p_1 - p_0},$$

where $p_0$ is the nominal value of process parameter, and $p_1$ is the value of process parameter after variation.

Since Within-Die (WID) variations need to be considered separately for each transistor, we need to take the cumulative effect. For the $n^{th}$ transistor, this would be.

$$S_n = \frac{\log[I(p_1)] - \log[I(p_0)]}{p_1 - p_0},$$

Once the sensitivities for all the transistors are available, sensitivity of leakage to normalized WID variation will be, $$S_{WID} = \sqrt{\sum_{n=1}^{N} (S_n \sigma_n)^2} \quad (1)$$

Where N is the number of transistors in the cell and $\sigma_n$ represents the standard deviation of the process parameter for the nth transistor. For more detail, see, for example, Kenichi Okada, Kento Yamaoka, and Hidetoshi Onodera "A Statistical Gate Delay Model Considering Intra-Gate Variability", ICCAD-03.

Process variations can be classified into two broad buckets: Die-to-Die (D2D) variations and Within-Die (WID) variations. The effect of each of these needs to be computed and specified as part of the models in terms of sensitivities of the leakage current, so that the analysis tool can accurately factor for these effects during analysis.

WID variation effect is very runtime intensive to compute. As the within-die variations can be random in occurrence and amount across a chip, their effects on all the elements of the circuit need to be considered. A typical technique used for computing the effect of process variations is to perturb the various process parameters independently, measure the effect of these perturbations on the leakage power, and then use the non-perturbed and the perturbed library leakage data to generate sensitivities of the library leakage data to variations. For D2D variations, one additional simulation is required per process-parameter under consideration, so if there are 5 process parameters being considered, the runtime cost goes up to 5× the runtime for nominal leakage measurement; but for WID variations, since the variations have to be considered on a per-transistor basis, the runtime cost becomes prohibitive.

To understand this, we need to see that characterization for WID effects involves perturbation of each individual transistor in a given subcircuit, and computing the effect of that to generate the sensitivity of the cell to WID variations. For example, if a subcircuit had 20 transistors, and we are looking at the effect of variation of 5 process parameters as in the case above, then, if Number of simulations for generation of nominal timing data=x, Then, Number of simulations for generation of WID variations sensitivity=20*5x=100x.

This is a considerable increase runtime overhead. Such simulations are already typically very computational intensive; and by taking the WID variations into account, what previously may have already been a very substantial run time of, say, a day, can now become weeks.

Consequently, there is room for improvement in the techniques available for incorporating the effects within die variations.

SUMMARY

The following presents methods, along with a corresponding system and a computer program product, for determining effects of process variations on the leakage of an integrated circuit having multiple devices. The operation of the circuit is simulated using a first set of values for the process parameters of the devices and is also simulated with some of the process parameter values varied. For the simulation with the varied values, the circuit is split up into distinct components (such as channeled coupled components, CCCs), where each component has one or more devices, and a process parameters value in a device in each of two or more of these components is varied.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 4 is a table showing the leakage current and sensitivity of a particular cell.

FIG. 6 is a table corresponding to FIG. 4, but utilizing the partition of FIG. 5 and the techniques presented here.

FIG. 7 is a table showing the reduction in needed simulations that result from applying the described approach to a particular cell library.

DETAILED DESCRIPTION OF EXEMPLARY EMBODIMENTS

Overview

Figure 1:
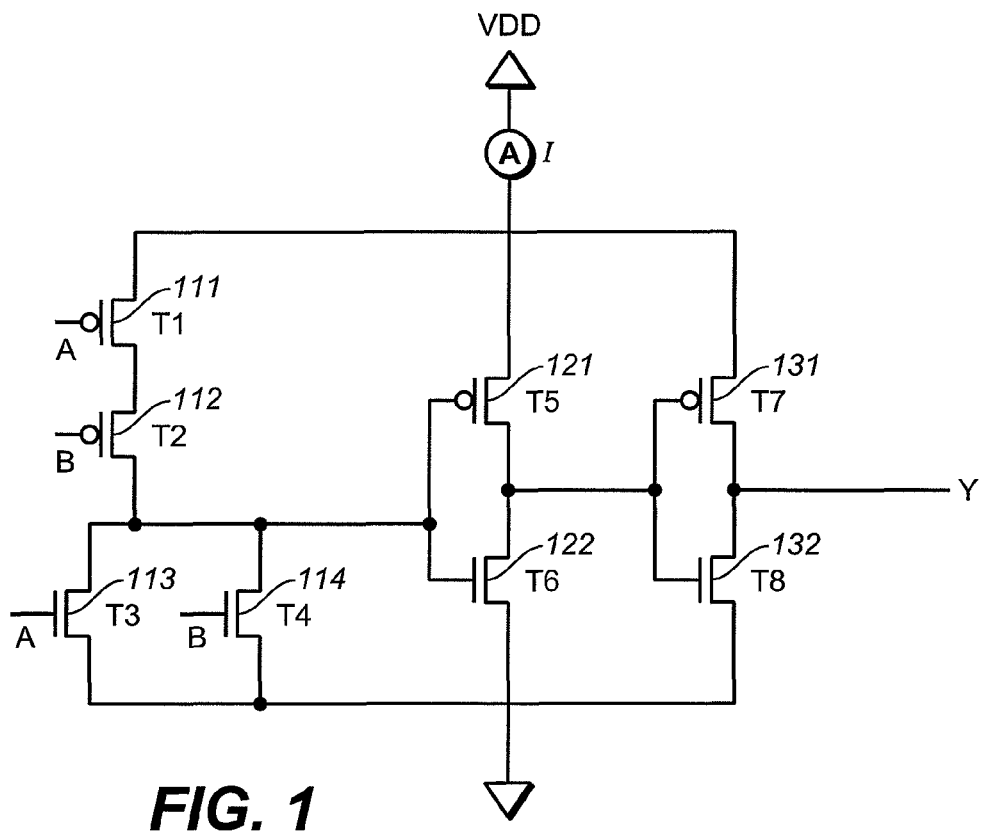
FIG. 1 illustrates a buffered NOR gate, on which the techniques presented here can be illustrated.

As noted above in the Background, capturing the effects of Within-Die (WID) variations on leakage can lead to a explosion in the runtime requirements for characterization. The following presentation proposes a new technique to partition the netlist of a cell (or block) in terms of channel connected components (CCCs) so that the effects of variations can be captured for multiple transistors at the same time. This leads to a substantial saving in runtime. It should be noted that although discussed in terms of some specific embodiments, these techniques can also be used more generally to account for other WID process variations (or even other effects resulting in device to device variations), such as for analysis of digital blocks. As will be familiar to those who work in the art, embodiments of the techniques presented here can be implemented as a circuit optimizer using a computer system or as a computer program product, such as those described: U.S. patent application Ser. No. 11/361,928, entitled "Method and System for Improving Yield of an Integrated Circuit", filed on Feb. 23, 2006, and U.S. Pat. Nos. 6,618,837; 7,177,783; and 7,219,045.

The proposed techniques for substantially reducing runtime are based on two observations:

1) Most standard cells (with the exception of simple cells like inverters or NANDs) have multiple stages, as defined in terms of CCC (Channel-connected components).

2) The leakage of a CCC can be computed independently of any other CCC. The rationale for this is as follows: the gate of a transistor acts as a very high impedance, and so current flow can be effectively be considered independently for components that are partitioned by gates of transistors. This is also the definition of a CCC. Therefore, the overall leakage of a cell can be directly computed from the leakages of the CCCs that make up the cell.

More information on partitioning into channel-connected components can be found, for example, in "Efficient Partitioning and Analysis of Digital CMOS-Circuits", U. Hubner H. T. Vierhaus, 1992 IEEE/ACM international conference proceedings on Computer-aided design.

From the two above observations, it follows that the leakage current measurement can be done independently for each CCC. Although this observation has no significance while doing nominal measurement (i.e. measurement with the process parameters set to their nominal values for each transistor in the subckt) as far as runtime is concerned, it can have enormous impact on the runtime of the measurement of effect of WID variations.

A simple example to illustrate this is the case of a simple buffer (a set of back to back inverters). This will have 4 transistors in 2 CCCs, with each CCC having 2 transistors. In the normal circumstances, capturing the effects of WID variations of one process parameter would need to do 4 additional simulations, one each by varying the process parameter for each transistor in the cell. By using the independence of CCCs (as far as leakage current is concerned), the same information can be captured using just two additional simulations. In this simple case this the runtime savings are 50% (in the ideal situation).

The exemplary flow for this is very simple:
1. Parse the subckt topology and break it into CCCs. Well-established techniques for this are know in the art.
2. Set up the simulation decks so that a current probe is added to each CCC (rather than at a global supply). This is explained in greater detail below
3. Perturb one transistor in each CCC at the same time.
4. Simulate and measure the currents in each CCC.

It can be seen that the number of independent simulations that needs to be done is equal to the number of the transistors in the largest CCC. It should again be noted that the while the discussion is given here mainly in terms of standard cell characterization methodology, the same technique can be used more generally, such as for analysis of large digital blocks, and should similarly provide very large savings in these other scenarios.

As another example to illustrate the improvements presented here, consider the buffered NOR gate of FIG. 1. As shown, this has the transistors T1-T4 111-114 receiving the inputs A and B, followed inverter by the transistors T5 121 and T6 122 and that of transistors T7 131 and T8 132. Previous methods, prior to those presented here, to capture the effects of WID variations on this cell would be as follows:

1. Set up a nominal simulation deck. In this, the transistors all have their nominal values for the process parameters, and a current probe is added at Vdd as shown in the figure. The input current I(0) is measured.
2. For each transistor (T1 through T8), vary a given process parameter, and set up a spice deck. This deck is virtually identical to the deck in the case above, except one transistor has a process parameter value modified by δp. Measure new currents, I(1)-I(8), for each of these.

In this case, the total number of simulations=1+8=9.

Sensitivity of leakage power to $n^{th}$ transistor will be $$Sn=[I(n)-I(0)]\partial p.$$

Typical standard cell libraries can have close to thousand cells, and the old approach has to create a spice deck for each transistor in each cell. For example, in a sample library of 800 cells, which is the approximate number in the typical case of a leading vendor, there are typically something on the order of 20,000 transistors that define the various cells. Under the previous techniques, the number of simulations require for a WID variation computation would consequently be 20000 multiplied by the number of process parameters being considered. The consequence in terms of the overhead in runtime is enormous; further, if one were to consider state dependent leakage, the number of simulations will increase yet further.

Similarly, for the case of digital blocks where the same kind of analysis needs to be done, this would require one to perturb each transistor in the block; however, as a digital block can be separated into CCCs, the techniques here can again be used and the same benefits in runtime can be gained.

Although accurately capturing the effect of WID variations on leakage requires perturbation of all the transistors, the techniques presented here utilize information about the circuit topology and about the measurement requirements to simplify the measurement, thereby making it tractable in terms of runtime. An important aspect in reducing runtime in the process described here is to identify the tasks that are causing the increase in runtime, and see which of those could be done simultaneously (in parallel). Here we observe that a basic requirement is that all the transistors need to be perturbed one by one and the leakage current variation due to this needs to be analyzed and used to generate sensitivity of leakage to process variations; however, we also observe that the effect of leakage can be computed independently for each CCC.

Consider that for a cell based design, the design is typically partitioned in terms of standard cells. (For purposes of this discussion, interconnects are ignored for now as they do not play a part in leakage.) The process presented here is breaking the design up further, by splitting the cell in terms of CCCs and computing the effect of variations on each CCC separately. While this approach adds no value while doing nominal analysis, it offers enormous runtime benefit when doing WID effects-based analyses. Given that the future of analysis is headed towards a statistical mode, this method will be of value for statistical leakage analysis.

Figure 2:
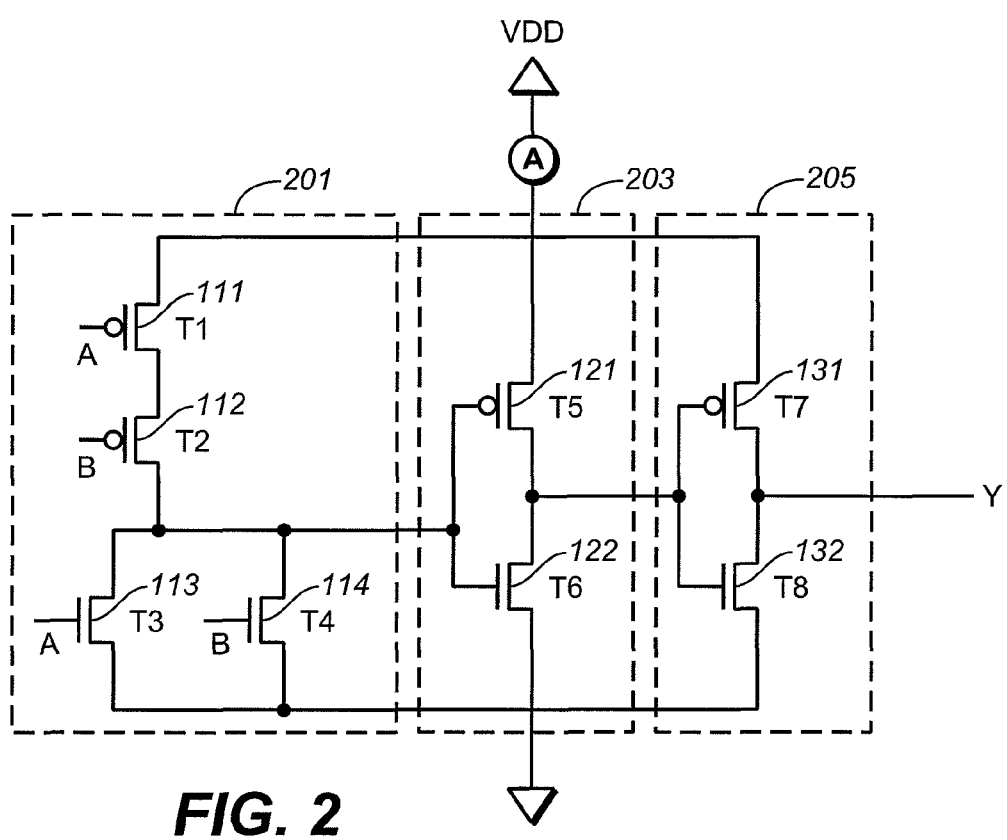
FIG. 2 shows the circuit of FIG. 1 split into channel connected components.

The basic acts of this process can be illustrated by using the circuit of FIG. 1, beginning with identifying the channel connected components in the cell. CCC identification is a fairly standard technique and can be implemented easily by doing a topological parse of the SPICE subckt definition. There are tools that already have this functionality embedded in them. This has almost no runtime penalty. In FIG. 2, the CCCs of the buffered NOR of FIG. 1 are demarcated using boxes, 201, 203, and 205.

Figure 3:
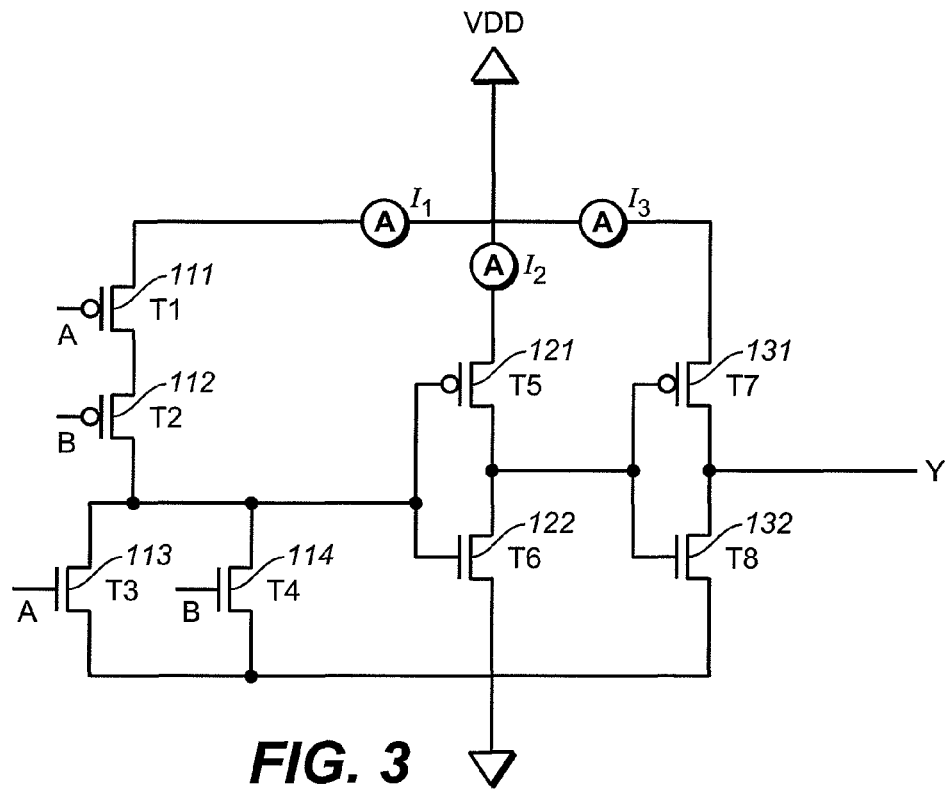
FIG. 3 illustrates having separate current meters for each channel connected components the circuit of FIG. 1.

This is followed by putting separate current meters for each CCC, as indicated by the A in FIG. 3, where $I_1$, $I_2$, and $I_3$ correspond to current of each CCC. This can be done as part of the CCC identification logic. Note that the current meters should only measure the current of that CCC.

Next follows a basic act in the technique, namely varying one transistor from each CCC and measure currents $I_1$, $I_2$, $I_3$. For the exemplary buffered NOR cell, there can be the following individual simulations:

Simulation 0: No Variation, Measure nominal currents $I_1(0)$, $I_2(0)$ and $I_3(0)$.

Simulation 1: Vary T1, T5, T7. Measure currents $I_1(1)$, $I_2(1)$, $I_3(1)$

Simulation 2: Vary T2, T6, T8. Measure currents $I_1(2)$, $I_2(2)$, $I_3(2)$

Simulation 3: Vary T3. Measure current $I_1(3)$

Simulation 4: Vary T4. Measure current $I_1(4)$

The total number of simulations is now five, compared to the nine simulations needed for varying each device individually, as described above with respect to FIG. 1. Consequently, the number of needed simulations is reduced by close to 50%.

It will be appreciated that the order described is just one of the possible ways of doing the simulations from the different CCCs in parallel. Additionally, the exemplary embodiment used the maximal amount of parallelism, which, although usually preferable, is not required. It should also be noted some cases, such as cell with a single CCC (simple inverters etc.), will not see any benefit in runtime.

The sensitivity of the transistors is then:

$$S_{T1} = [I_1(1) - I_1(0)]/\partial p \quad S_{T2} = [I_1(2) - I_1(0)]/\partial p$$
$$S_{T3} = [I_1(3) - I_1(0)]/\partial p \quad S_{T4} = [I_1(4) - I_1(0)]/\partial p$$
$$S_{T5} = [I_2(1) - I_2(0)]/\partial p \quad S_{T6} = [I_2(2) - I_2(0)]/\partial p$$
$$S_{T7} = [I_3(1) - I_3(0)]/\partial p \quad S_{T8} = [I_3(2) - I_3(0)]/\partial p$$

More generally, consider the case where there are n transistor in the cell and, after diving the cell into CCCs, the number of transistors in biggest CCC is m. Conventional approaches would requires n+1 SPICE simulations, whereas the method given here requires m+1 spice simulations. For cells with a single CCC, n=m. For cells with more than one CCC, n>m. Since most of the cells in a library have more than one CCC, the present approach will reduce the number of spice runs for most of the cells in the library.

Consequently, a major advantage of the technique described here is that it can reduce the simulation requirements for factoring in the effect of WID variations for leakage significantly. The technique does not have any dependence on the type of sensitivity being generated (i.e. derating factor, linear-sensitivities, quadratic sensitivities etc.), or the type of simulation setup, but can provide speedup in all cases where the cell/block being characterized has multiple CCCs.

While the focus here is on characterization of standard cells, this technique can easily be applied to larger digital blocks effectively. Further, as statistical analysis is a growing field expected to be the de-facto analysis technique for the next generation process nodes, these kind of technique will be very useful in the future for timing and other kinds of electrical analysis.

The exemplary buffered NOR cell of FIGS. 1-3 is a relatively basic case. To further illustrate the utility of the techniques presented here, they have been more widely applied to the case of a 65 nm library with approximately 800 cells.

To illustrate the level of accuracy for the approach given here, the method is first illustrated on a 3 input, 4× drive XOR gate (cell XOR3D4) from the library, a cell having 40 transistors. The mismatch parameter, called A1 here for convenience, has a standard deviation of 1 and is used as an exemplary process parameter to illustrate this. First, the cell is characterized using a conventional approach, where A1 of each transistor in the cell is a varied in one SPICE run and the change in leakage current is measured. The Nominal Leakage Current is I(0)=1.38336 and the table of FIG. 4 show the results of the variations. The corresponding within die of this cell is then:

$$S_{WID} = \sqrt{\sum_{i=1}^{N} (S_i)^2} = 0.09425.$$

Figure 5:
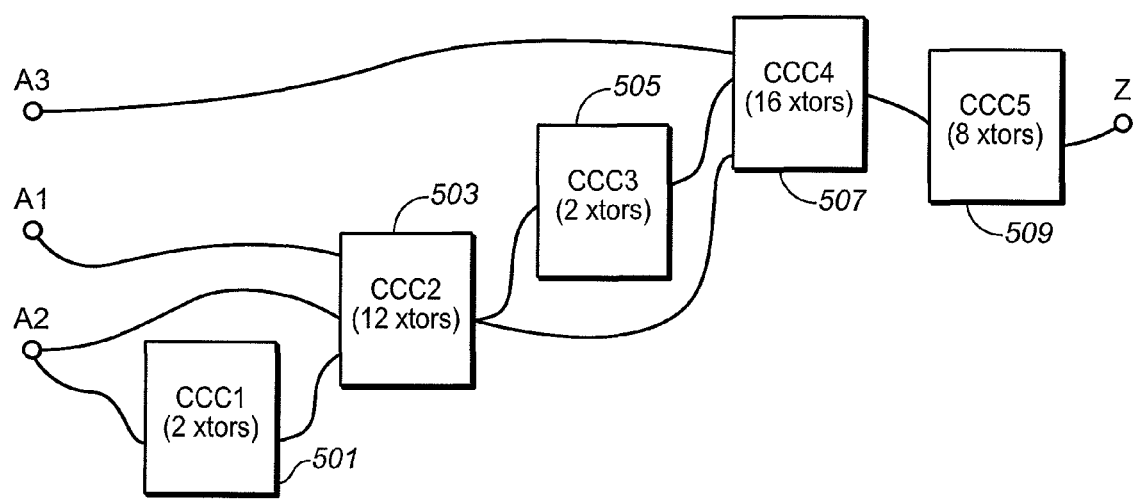
FIG. 5 shows a partition into channel coupled components of the cell corresponding to FIG. 4.

To now apply the techniques presented here, the cell is partitioned into CCCs as shown in FIG. 5. As seen there, the cell has three inputs, shown as A1, A2, A3, and output labeled Z. The cell has 5 CCCs, CCC1 501, CCC2 503, CCC3 505, CCC4 507, and CCC5 509, arranged with the topology shown and where the number of transistors in each component is given. The correspondence of the five components to the 40 transistors listed in the table of FIG. 4 is:

CCC1(Size 2)=M19 M27
CCC2(Size 12)=M35 M26 M18 M20 M25 M33 M34 M36 M14 M15 M16 M17
CCC3(Size 2)=M11 M28
CCC4(Size 16)=M22 M29 M9 M30 M10 M31 M32 M24 M21 M12 M13 M23 M1 M2 M3 M4
CCC5(Size 8)=M39 M40 M6 M8 M7 M37 M38 M5

As the largest of these (CCC4) has 16 elements, the previous 40 simulations can be reduced down to 16.

Current meters were placed at the supply of the various CCCs, with the currents drawn at each are correspondingly labeled $I_1$, $I_2$, $I_3$, $I_4$ and $I_5$. Running a SPICE simulation with nominal values of process parameter and currents gives:

| $I_1(0)$ | $I_2(0)$ | $I_3(0)$ | $I_4(0)$ | $I_5(0)$ |
|---|---|---|---|---|
| 0.029015 | 0.315363 | 0.112213 | 0.516105 | 0.410629 |

As the largest of the CCCs has 16 transistors, the methods described here will use 16 SPICE runs for variations, with one transistor from each CCC varied in a given run. The currents measured from these 16 SPICE runs are collected in the table of FIG. 6.

(It should again be noted that the order in which the transistors were varied in the different runs is just one of the many possible choices, as is the number of runs, with 16 being the values when maximal parallelism is employed for this particular cell.)

Consequently, from FIG. 6, the sensitivities of all 40 transistors in the call are computed in only 16 runs by vary more than one transistor per run. Using these sensitivity values to compute WID leakage sensitivity gives:

$$S_{WID} = \sqrt{\sum_{i=1}^{N} (S_i)^2} = 0.09345.$$

As can be seen by comparing with the sensitivity value obtained where each of the 40 transistors was varied, this gives as error of:

% Error=(0.09345−0.09425)/0.09425=−0.8%

Hence, the approached presented here reduced number of SPICE simulations needed to account for variations significantly (from 40 to 16), without any significant impact on the accuracy (less than 1% error) of results.

Using these techniques, the run-time saving on all 803 cells in this library can similarly be estimated. The table of FIG. 7 shows run-time reduction for some of the cells explicitly, with the totals for the library shown at bottom. As shown there, the approach presented here reduces number of SPICE simulations—and hence the statistical leakage characterization time—by about half.

The formulation presented here can be incorporated into the various simulation environments used in design processes, typically, but not necessarily, SPICE simulations as mentioned above. Examples of commercially available SPICE simulators include the Spectre simulator from Cadence, the Eldo simulator from Mentor Graphics and the HSPICE simulator from Synopsys. Further, although the various aspects of the present invention have been described with respect to exemplary embodiments thereof, it will be understood that the present invention is entitled to protection within the full scope of the appended claims.

It will also be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

It is claimed:

1. A method of determining the effects of process variations on the leakage of an integrated circuit containing multiple devices, comprising:
   dividing the circuit into a plurality of distinct components, each component having one or more of said devices, and at least one component having multiple devices;
   simulating operation of the plurality of distinct components of the circuit using a first set of process parameter values of the devices, the first set of process parameter values corresponding to physical attributes of the devices in the plurality of distinct components;
   measuring a first set of currents in each of the corresponding components using respective current meters during the simulated operation of the plurality of the distinct components when the components use the first set of process parameter values;
   using the first set of process parameter values, varying process parameter values of devices corresponding to two or more of the distinct components while not varying the process parameter values of one or more other devices corresponding to the two or more distinct components to form a varied second set of process parameter values of the devices, the varied second set of process parameter values corresponding to physical attributes of the devices in the plurality of distinct components;

simulating operation of the plurality of distinct components of the circuit using the varied second set of process parameter values of the devices;

measuring a second set of currents in each of the corresponding components using the respective current meters during the simulated operation of the plurality of the distinct components when the components use the varied second set of process parameter values; and determining sensitivity of the circuit to variations of the process parameter values corresponding to the physical attributes of the devices in the plurality of distinct components using the measured first set of currents and the measured second set of currents.

2. The method of claim 1, wherein the distinct components are channel connected components.

3. The method of claim 1, wherein the sensitivity is leakage sensitivity.

4. The method of claim 1, wherein the first set of process parameter values are nominal process parameter values of the devices.

5. The method of claim 1, wherein the plurality of distinct components are standard cells.

6. The method of claim 1, wherein the plurality of distinct components are digital blocks.

7. The method of claim 1, wherein the process variations are within die variations.

8. The method of claim 1, further comprising:
identifying a maximum number of devices among each of the plurality of distinct components; and
repeating steps (a) to (d) until a last device of a distinct component that has the maximum number of devices is simulated:
(a) generating a new set of process parameter values of the devices by varying a process parameter value of a different device in each of the plurality of distinct components;
(b) simulating operation of the plurality of distinct components in parallel using the new set of process parameter values of the devices;
(c) measuring a new set of currents in the corresponding components during simulation using the new set of process parameter values;
(d) determining sensitivity of the circuit to process variations from the first set of currents measured and the new set of currents measured.

9. The method of claim 1, wherein:
simulating operation of the circuit using a first set of process parameter values includes simulating operation of the plurality of distinct components in parallel using the first set of process parameter values of the devices; and
simulating operation of the circuit using a second set of process parameter values includes simulating operation of the plurality of distinct components in parallel using the second set of process parameter values of the devices.

10. The method of claim 1, wherein not varying the process parameter values involves not varying the process parameter values of any other device of the two or more distinct components to form a second set of process parameter values of the devices.

11. The method of claim 1, wherein the determining sensitivity of the circuit to process variations from the first set of currents measured and the second set of currents measured includes determining a difference between one or more measured currents of the first set of currents and one or more measured currents of the second set of currents.

12. The method of claim 1, wherein the dividing the circuit into the plurality of distinct components includes dividing the circuit into a plurality of distinct components wherein each component includes one or more transistors;
wherein the simulating operation of the plurality of distinct components of the circuit using the first set of process parameter values includes using process parameter values corresponding to an oxide thickness of the one or more transistors; and
wherein the simulating operation of the plurality of distinct components of the circuit using the varied second set of process parameter values includes using process parameter values corresponding to the same oxide thickness of the one or more transistors.

13. The method of claim 1, wherein the dividing the circuit into the plurality of distinct components includes dividing the circuit into a plurality of distinct components wherein each component includes one or more transistors;
wherein the simulating operation of the plurality of distinct components of the circuit using the first set of process parameter values includes using process parameter values corresponding to a gate length of the one or more transistors; and
wherein the simulating operation of the plurality of distinct components of the circuit using the varied second set of process parameter values includes using process parameter values corresponding to the same gate length of the one or more transistors.

14. The method of claim 1, wherein the dividing the circuit into the plurality of distinct components includes dividing the circuit into a plurality of distinct components wherein each component includes one or more transistors;
wherein the simulating operation of the plurality of distinct components of the circuit using the first set of process parameter values includes using process parameter values corresponding to a gate width of the one or more transistors; and
wherein the simulating operation of the plurality of distinct components of the circuit using the varied second set of process parameter values includes using process parameter values corresponding to the same gate width of the one or more transistors.

15. The method of claim 1, wherein the dividing the circuit into the plurality of distinct components includes dividing the circuit into a plurality of distinct components wherein each component includes one or more transistors;
wherein the simulating operation of the plurality of distinct components of the circuit using the first set of process parameter values includes using process parameter values corresponding to a doping density of the one or more transistors; and
wherein the simulating operation of the plurality of distinct components of the circuit using the varied second set of process parameter values includes using process parameter values corresponding to the same doping density of the one or more transistors.

16. A computer program product for determining process variations on the leakage of an integrated circuit containing multiple devices, including a non-transitory computer readable medium storing executable program code, the computer program product comprising code for performing the method of:
dividing the circuit into a plurality of distinct components, each component having one or more of said devices, and at least one component having multiple devices;

simulating operation of the plurality of distinct components of the circuit using a first set of process parameter values of the devices, the first set of process parameter values corresponding to physical attributes of the devices in the plurality of distinct components;

measuring a first set of currents in each of the corresponding components using respective current meters during the simulated operation of the plurality of the distinct components when the components use the first set of process parameter values;

using the first set of process parameter values, varying process parameter values of devices corresponding to two or more of the distinct components while not varying the process parameter values of one or more other devices corresponding to the two or more distinct components to form a varied second set of process parameter values of the devices, the varied second set of process parameter values corresponding to physical attributes of the devices in the plurality of distinct components;

simulating operation of the plurality of distinct components of the circuit using the varied second set of process parameter values of the devices;

measuring a second set of currents in each of the corresponding components using the respective current meters during the simulated operation of the plurality of the distinct components when the components use the varied second set of process parameter values; and determining sensitivity of the circuit to variations of the process parameter values corresponding to the physical attributes of the devices in the plurality of distinct components using the measured first set of currents and the measured second set of currents.

17. The computer program product of claim 16, wherein the distinct components are channel connected components.

18. The computer program product of claim 16, wherein the sensitivity is leakage sensitivity.

19. The computer program product of claim 16, wherein the process variations are within die variations.

20. The computer program product of claim 16, wherein the code for performing the method of not varying the process parameter values involves not varying the process parameter values of any other device of the two or more distinct components to form a second set of process parameter values of the devices.

21. The computer program product of claim 16, wherein the code for performing the method of determining sensitivity of the circuit to process variations from the first set of currents measured and the second set of currents measured includes code for determining a difference between one or more measured currents of the first set of currents and one or more measured currents of the second set of currents.

22. A system for a design process of an integrated circuit containing multiple devices, comprising:

a user interface for viewing representations of the integrated circuit on a display; and at least one processing unit including circuitry to determine process variations on the leakage of the integrated circuit, including dividing the circuit into a plurality of distinct components, each component having one or more of said devices, and at least one component having multiple devices; simulating operation of the plurality of distinct components of the circuit using a first set of process parameter values of the devices, the first set of process parameter values corresponding to physical attributes of the devices in the plurality of distinct components; measuring a first set of currents in each of the corresponding components using respective current meters during the simulated operation of the plurality of the distinct components when the components use the first set of process parameter values; using the first set of process parameter values, varying process parameter values of devices corresponding to two or more of the distinct components while not varying the process parameter values of one or more other devices of corresponding to the two or more distinct components to form a varied second set of process parameter values of the devices, the varied second set of process parameter values corresponding to physical attributes of the devices in the plurality of distinct components; simulating operation of the plurality of distinct components of the circuit using the varied second set of process parameter values of the devices; measuring a second set of currents in each of the corresponding components using the respective current meters during the simulated operation of the plurality of the distinct components when the components use the varied second set of process parameter values; and determining sensitivity of the circuit to variations of the process parameter values corresponding to the physical attributes of the devices in the plurality of distinct components using the measured first set of currents and the measured second set of currents.

23. The system of claim 22, wherein the distinct components are channel connected components.

24. The system of claim 22, wherein the sensitivity is leakage sensitivity.

25. The system of claim 22, wherein the plurality of distinct components are standard cells.

26. The system of claim 22, wherein the plurality of distinct components are digital blocks.

27. The system of claim 22, wherein the process variations are within die variations.

28. The system of claim 22, wherein:

simulating operation of the circuit using a first set of process parameter values includes simulating operation of the plurality of distinct components in parallel using the first set of process parameter values of the devices; and simulating operation of the circuit using a second set of process parameter values includes simulating operation of the plurality of distinct components in parallel using the second set of process parameter values of the devices.

29. The system of claim 22, wherein not varying the process parameter values involves not varying the process parameter values of any other device of the two or more distinct components to form a second set of process parameter values of the devices.

30. The system of claim 22, wherein the determining sensitivity of the circuit to process variations from the first set of currents measured and the second set of currents measured includes determining a difference between one or more measured currents of the first set of currents and one or more measured currents of the second set of currents.

* * * * *

UNITED STATES PATENT AND TRADEMARK OFFICE
CERTIFICATE OF CORRECTION

Page 1 of 1

PATENT NO. : 8,612,199 B2
APPLICATION NO. : 11/961787
DATED : December 17, 2013
INVENTOR(S) : Sachin Shrivastava et al.

It is certified that error appears in the above-identified patent and that said Letters Patent is hereby corrected as shown below:

In the Claims

Col. 12, line 12, please delete "of" (second occurrence).

Signed and Sealed this
Nineteenth Day of August, 2014

Michelle K. Lee
*Deputy Director of the United States Patent and Trademark Office*